(12) United States Patent
Yamada et al.

(10) Patent No.: US 8,747,555 B2
(45) Date of Patent: Jun. 10, 2014

(54) THIN FILM PRODUCTION APPARATUS AND INNER BLOCK FOR THIN FILM PRODUCTION APPARATUS

(75) Inventors: Takakazu Yamada, Susono (JP); Osamu Irino, Susono (JP); Tsuyoshi Kagami, Susono (JP)

(73) Assignee: Ulvac, Inc., Kanagawa (JP)

( * ) Notice: Subject to any disclaimer, the term of this patent is extended or adjusted under 35 U.S.C. 154(b) by 907 days.

(21) Appl. No.: 12/299,936

(22) PCT Filed: Apr. 27, 2007

(86) PCT No.: PCT/JP2007/059229
§ 371 (c)(1),
(2), (4) Date: Dec. 16, 2008

(87) PCT Pub. No.: WO2007/129622
PCT Pub. Date: Nov. 15, 2007

(65) Prior Publication Data
US 2009/0159006 A1    Jun. 25, 2009

(30) Foreign Application Priority Data
May 9, 2006    (JP) ................................. 2006-129761

(51) Int. Cl.
*C23C 16/00* (2006.01)
*C23F 1/00* (2006.01)
*H01L 21/306* (2006.01)

(52) U.S. Cl.
USPC .................. 118/715; 156/345.33; 156/345.37; 118/724

(58) Field of Classification Search
CPC .............. C23C 16/4412; C23C 16/455; C23C 16/45565; H01J 37/3244; H01J 37/321; H01J 37/32449; H01J 37/32082; H01J 37/32091; H01J 37/32623; H01J 37/32651; H01J 37/32174; H01L 21/67069
USPC ............. 118/715, 723 MW, 724; 156/345.33, 156/345.37, 345.41; 315/111.21, 111.71
See application file for complete search history.

(56) References Cited

U.S. PATENT DOCUMENTS 5,134,965 A * 8/1992 Tokuda et al. ......... 118/723 MW
5,871,586 A * 2/1999 Crawley et al. ............... 118/715
(Continued)

FOREIGN PATENT DOCUMENTS

JP          200293789 A       3/2002
JP          2004035971         2/2004
(Continued)

*Primary Examiner* — Rakesh Dhingra
(74) *Attorney, Agent, or Firm* — Harness, Dickey & Pierce, PLC

(57) ABSTRACT

Provided is a thin film production apparatus that enables cost reduction and improvement of deposition efficiency by employing a common component. In a thin film production apparatus according to the present invention, a volume of a reaction space is optimized by determining the volume of the reaction space with an inner block disposed inside a vacuum tank, that is, by merely altering a size of an inner diameter of the inner block without altering a size of the vacuum tank. Accordingly, film formation on plural kinds of substrates having different sizes becomes possible using the common vacuum tank. Further, increase of the number of apparatus structural components to be prepared for each size of the substrate to be processed can be minimized, whereby the cost of the components can be reduced, and, while simplifying assembling operation, product inspection operation, and adjusting operation, excellent deposition efficiency and stable film formation can be realized.

16 Claims, 5 Drawing Sheets

(56) References Cited

U.S. PATENT DOCUMENTS

| | | | |
|---|---|---|---|
| 5,874,012 A * | 2/1999 | Kanai et al. | 216/67 |
| 5,904,800 A * | 5/1999 | Mautz | 156/345.1 |
| 6,092,486 A * | 7/2000 | Mabuchi et al. | 118/723 MW |
| 6,099,651 A * | 8/2000 | Sajoto et al. | 118/715 |
| 6,106,625 A * | 8/2000 | Koai et al. | 118/715 |
| 6,129,808 A * | 10/2000 | Wicker et al. | 156/345.1 |
| 6,554,979 B2 * | 4/2003 | Stimson | 204/298.06 |
| 6,911,092 B2 * | 6/2005 | Sneh | 118/715 |
| 2001/0010257 A1 * | 8/2001 | Ni et al. | 156/345 |
| 2001/0032591 A1 * | 10/2001 | Carducci et al. | 118/723 E |
| 2001/0054383 A1 * | 12/2001 | Pu et al. | 118/723 I |
| 2002/0015855 A1 * | 2/2002 | Sajoto et al. | 428/639 |
| 2002/0069970 A1 * | 6/2002 | Noorbakhsh et al. | 156/345.37 |
| 2005/0059246 A1 * | 3/2005 | Yamada et al. | 438/689 |
| 2005/0173239 A1 * | 8/2005 | Somekh et al. | 204/192.13 |
| 2007/0051312 A1 * | 3/2007 | Sneh | 118/719 |
| 2007/0256785 A1 * | 11/2007 | Pamarthy et al. | 156/345.33 |

FOREIGN PATENT DOCUMENTS

| | | | | |
|---|---|---|---|---|
| JP | | 2004149881 A | 5/2004 | |
| JP | | 200593576 A1 | 4/2005 | |
| JP | | 2005197600 A | 7/2005 | |
| WO | WO 2005/015613 | * | 2/2005 | C23C 16/00 |

* cited by examiner

THIN FILM PRODUCTION APPARATUS AND INNER BLOCK FOR THIN FILM PRODUCTION APPARATUS

FIELD

The present invention relates to a thin film production apparatus such as an MOCVD apparatus. More specifically, the present invention relates to a thin film production apparatus and an inner block for a thin film production apparatus capable of adjusting a volume of a reaction space depending on a size of a substrate to be processed.

BACKGROUND

In recent years, in the field of semiconductors, manufacturers of semiconductor production apparatuses tend to provide apparatuses diversified in order to meet various process demands, but are, at the same time, required to meet demands for improvement of deposition efficiency, earlier delivery, and cost reduction.

Meanwhile, in the past, thin film production apparatuses for producing a thin film by employing an MOCVD (Metal Organic Chemical Vapor Deposition) method have been known (refer to Patent Document 1 below). With regard to the semiconductor production apparatuses employing this kind of chemical reaction process, there is a strong demand in the market to improve deposition efficiency, i.e., gas use efficiency. Specifically, a long-term apparatus operation cost is more emphasized recently than a price of a semiconductor production apparatus itself because most liquid materials are expensive, so the deposition efficiency can be a decisive factor in selection of an apparatus.

Patent Document 1: Japanese Patent Application Laid-open No. 2004-35971

SUMMARY

However, one semiconductor production apparatus is constituted by a plurality of process modules, and one process module is constituted by, for example, approximately a thousand components. Diversification of apparatuses causes differences in structural components, which then requires as many assembly operation processes and component adjusting methods as the number of the different components, with the result that operation categories are increased in number to inhibit the assembly operations and product inspection operations, whereby the early delivery demand cannot be met. Further, the increased number of component categories also increases the number of order operations, delivery date confirmation operations, and reception operations as much as the number of the components, thereby bulging purchase-related operations. Moreover, from a viewpoint of purchasing the components, the increased number of component categories may inhibit budget priority of bulk purchase, and, in addition, delivery of each component may lead to a failure in meeting the early delivery demand. In addition, from a viewpoint of selling the components, the different components require different settings of processing machines and cutting tools, whereby labor hours required for changing the setting backfire on prices and delivery dates.

Meanwhile, in the thin film production apparatus employing the chemical reaction process such as the MOCVD method, in order to improve the deposition efficiency, the reaction space is required to be structured as small as possible in accordance with the substrate. However, in the case where the vacuum tank size is altered for each substrate size, various components such as piping and equipment connected to the vacuum tank are changed. The alteration of the mechanical components may lead to alteration of electronic components such as sensors and wirings, and the alteration of the electronic components may alter control software, which eventually leads to a large number of component categories. Further, in the entire field of semiconductors, there is a large demand for decreasing $CO_2$ (carbon dioxide), so there is a strong demand in decreasing operation power consumption also from viewpoints of apparatus operation cost reduction and $CO_2$ reduction.

The present invention has been made in view of the above-mentioned problems, and it is an object of the present invention to provide a thin film production apparatus and an inner block for a thin film production apparatus that enable cost reduction and improvement of deposition efficiency by employing a common component.

To solve the above-mentioned problems, according to the present invention, a thin film production apparatus having a vacuum tank, a lid body closing an upper portion of the vacuum tank, a stage for supporting a substrate to be processed, and a gas head mounted to the lid body such that the gas head is opposed to the stage, includes an inner block disposed between the vacuum tank and the lid body and including a built-in heating source, for determining a volume of a reaction space between the stage and the gas head.

According to the present invention, by determining a volume of the reaction space by the inner block disposed inside the vacuum tank, the volume of the reaction space is optimized by merely altering a size of the inner block without altering a size of the vacuum tank. With this structure, film formation on plural kinds of substrates having different sizes is enabled using the common vacuum tank. Further, increase of the number of apparatus structural components to be prepared for each size of the substrate to be processed can be minimized, whereby the cost of the components can be reduced, and, while simplifying assembling operation, product inspection operation, and adjusting operation, excellent deposition efficiency and stable film formation can be realized.

Preferably, the inner block is an annular block body disposed between an inner wall surface of the vacuum tank and an outer circumferential portion of the stage, and is mounted to the vacuum tank and the lid body via seal members. With the inner block having the above structure, the volume of the reaction space can be readily optimized by merely altering an inner diameter of the block body in accordance with the substrate size.

Further, the inner block includes a heating source, and heat adjustment is executed to a predetermined process temperature during film formation, thereby improving gas use efficiency and deposition efficiency. Moreover, by merely maintaining the predetermined process temperature at least only in an area of the inner block opposed to the reaction space instead of the entire inner block, power consumption can be decreased. In this case, by forming the spatial area opposed to a low temperature portion of the inner block larger in volume than the reaction space, and preferably by introducing an inert gas for controlling gas partial pressure into the spatial area, precipitation of material elements of the deposition gas onto a surface of the low temperature portion of the inner block can be suppressed.

As described above, according to the present invention, film formation on plural kinds of substrates having different sizes is enabled using a common vacuum tank. Further, increase of the number of apparatus structural components to be prepared for each size of the substrate to be processed can be minimized, whereby the cost of the components can be reduced, and, while simplifying assembling operation, product inspection operation, and adjusting operation, excellent deposition efficiency and stable film formation can be realized.

DRAWINGS

Figure 6:
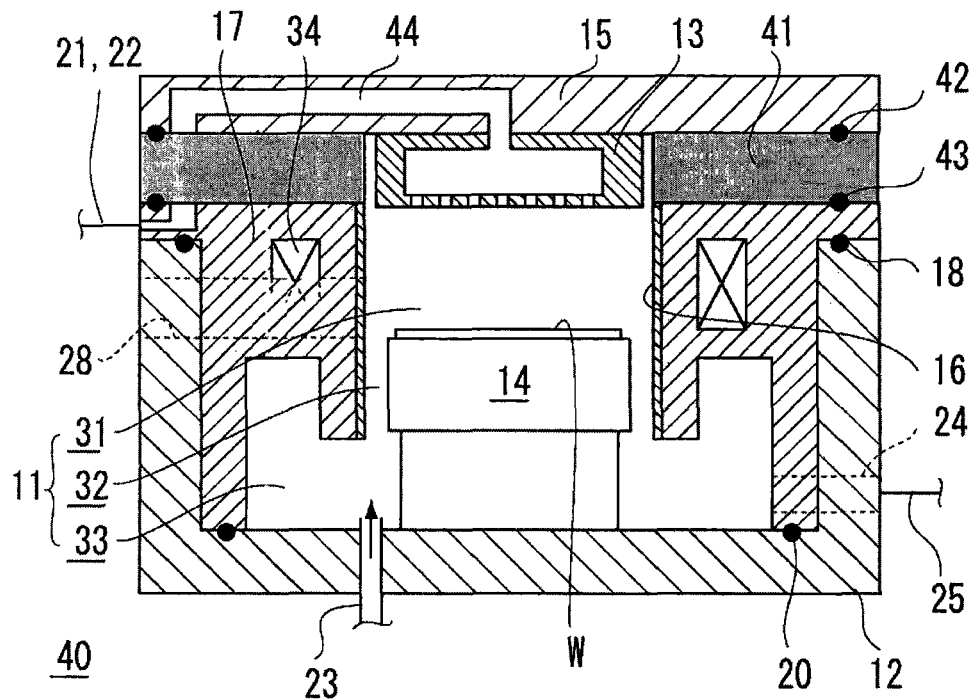
Figure 7A:
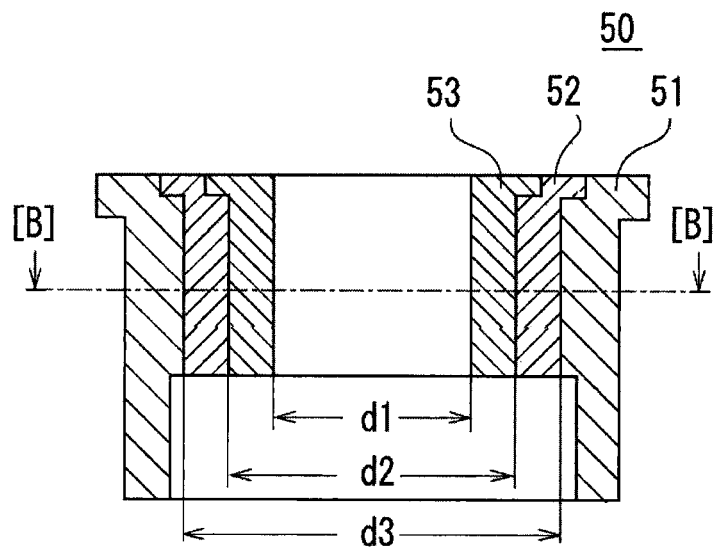
Figure 7B:
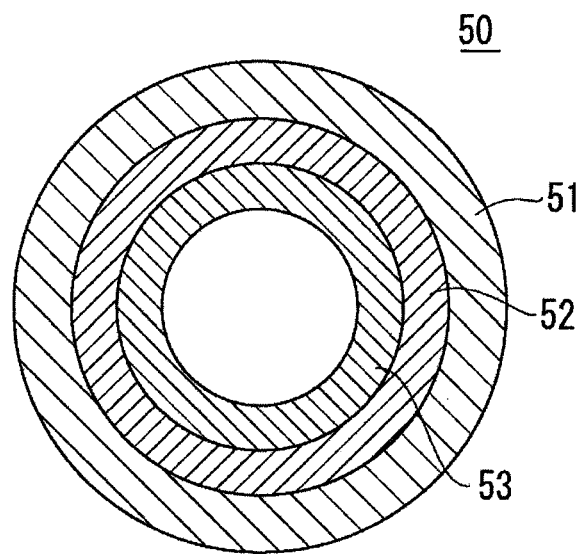

FIG. 6 is a schematic sectional diagram showing a structure of a thin film production apparatus according to another embodiment of the present invention; and FIG. 7 are diagrams showing a modification example of a structure of an inner block for the thin film production apparatuses according to the embodiments of the present invention, FIG. 7A being a side sectional view thereof, FIG. 7B being a sectional view thereof taken along the line [B]-[B] of FIG. 7A.

DETAILED DESCRIPTION

Hereinafter, embodiments of the present invention will be described with reference to the drawings.

Figure 1:
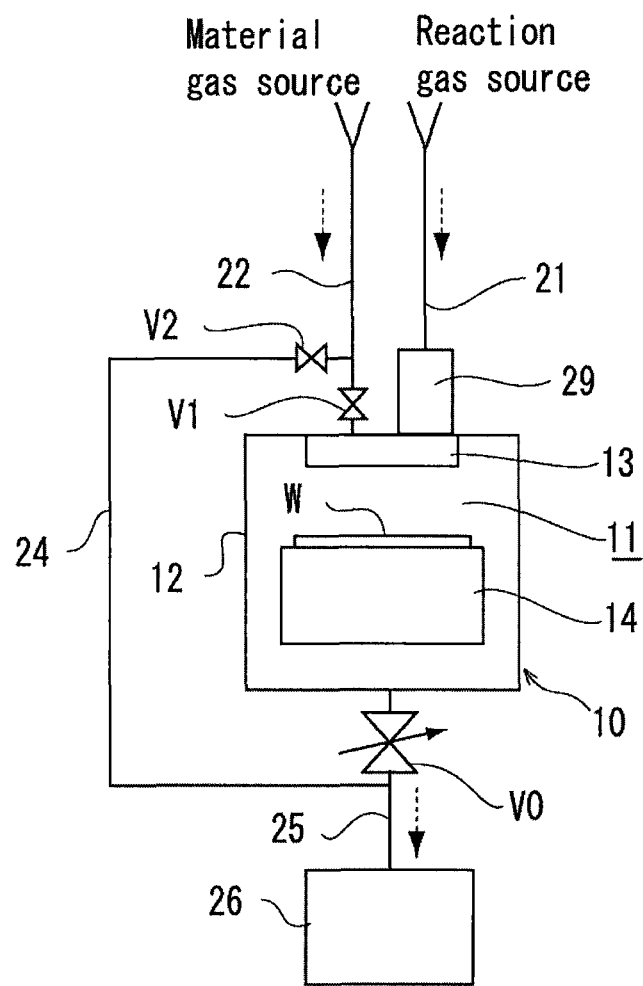
FIG. 1 is a piping arrangement diagram of a thin film production apparatus according to an embodiment of the present invention.

FIG. 1 is a piping arrangement diagram of a deposition gas supply line and a vacuum exhaust line of a thin film production apparatus 10 according to an embodiment of the present invention. It should be noted that, in the description, the "deposition gas" refers to an unmixed gas such as a material gas, a reaction gas, or an inert gas or a mixed gas thereof used in a chemical reaction.

The thin film production apparatus 10 according to this embodiment includes a vacuum tank 12 having a processing chamber (film formation chamber) 11 formed therein, a gas head 13 for introducing a deposition gas into the processing chamber 11, and a stage 14 disposed in the processing chamber 11, for supporting a substrate to be processed (hereinafter referred to as "substrate") W such as a semiconductor wafer or a glass substrate.

The processing chamber 11 is connected via a vacuum exhaust line 25 to a vacuum exhaust apparatus 26, and is structured such that, when opening a main valve V0, the processing chamber 11 can be evacuated to a predetermined reduced-pressure atmosphere. The stage 14 is arranged so as to be opposed to the gas head 13. The stage 14 is made of, for example, a hot plate, and is capable of heating the substrate W placed on the stage 14 to a predetermined temperature.

The gas head 13 is connected to a reaction gas supply line 21 communicating with a reaction gas source and a material gas supply line 22 communicating with a material gas source as will be described later in detail, and introduces a reaction gas and a material gas, or a mixed gas thereof into the processing chamber 11. In this embodiment, the gas head 13 employs a shower head provided with plural gas ejection holes.

As the reaction gas, $NH_3$ (ammonia gas), $H_2$ (hydrogen gas), or the like is used. As the material gas, an organic metal material including metallic species (Ta, Cu, Al, Ti, Zr, V, Nb) to be deposited is used, which is selected depending on an intended application (wiring film, barrier film, etc.). In this case, as the reaction gas, an activated nitride gas, e.g., ammonia gas is used so that a nitride film of the above metal is formed. As the inert gas, $N_2$ or Ar is used.

Figure 2:
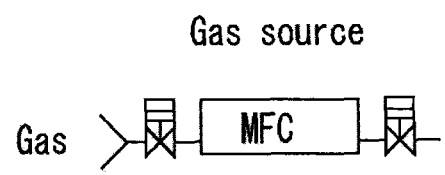
FIG. 2 is a diagram showing an example of a configuration of a reaction gas source.
Figure 3:
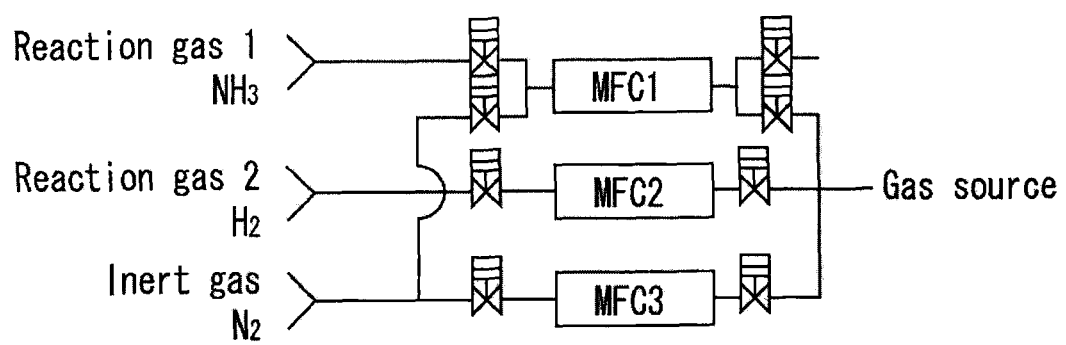
FIG. 3 is a diagram showing another example of the configuration of the reaction gas source.

Herein, a description will be made of the reaction gas source. The reaction gas source is a generally-used gas source (reaction gas source, inert gas source, etc.) whose gas flow rate can be controlled using a mass flow controller (MFC) as shown in FIG. 2. One integration-type gas source can supply a plurality of gases therefrom. FIG. 3 exemplifies the integration-type gas source. In the example shown in the figure, a reaction gas 1 is $NH_3$, a reaction gas 2 is $H_2$, and an inert gas is $N_2$. Unmixed gases thereof or a mixed gas thereof can be used as a gas source.

Regarding the material gas source, there is employed a system in which a solid or liquid organic metal material is gasified to obtain a material gas. In the case of the liquid material, there is employed a vaporizing system in which a liquid is supplied to a vaporizer to be vaporized, or a bubbling system. In the case of the solid material, there is employed a combined system of a material heating system in which a solid is heated to be liquefied and then vaporized by the vaporizer and the vaporizing system, a combined system of a heating system and the bubbling system, a sublimation system in which a solid material is gasified, or the like. It should be noted that the material gas is not limited to the organic metal material and can employ a gas such as $WF_6$ generally used in a semiconductor production process.

The reaction gas and the material gas introduced into the processing chamber 11 chemically-react with each other to form a metal thin film on the substrate W. A by-product and a redundant gas are discharged via the vacuum exhaust line 25.

The reaction gas and the material gas may be introduced into the film formation chamber 11 simultaneously or separately. By opening/closing a first valve V1, the material gas supply line 22 is switched between introduction/non-introduction of the material gas. It should be noted that, when the first valve V1 is closed, by opening a second valve V2, the material gas can be discharged via a bypass piping 24, not via the processing chamber 11. In this case, the second valve V2 is closed during film formation and is opened when the film formation is finished. By supplying the material gas as described above, the material gas can be stably introduced into the processing chamber 11.

Further, it is possible to activate the reaction gas and then introduce the gas into the processing chamber 11. In this embodiment, in the vicinity of the gas head 13, a radical source 29 for exciting the reaction gas supplied via the reaction gas supply line 21 to produce a radical gas is disposed. As the radical source 29, a catalytic wire heated to a high temperature, for example, is employed.

Figure 4:
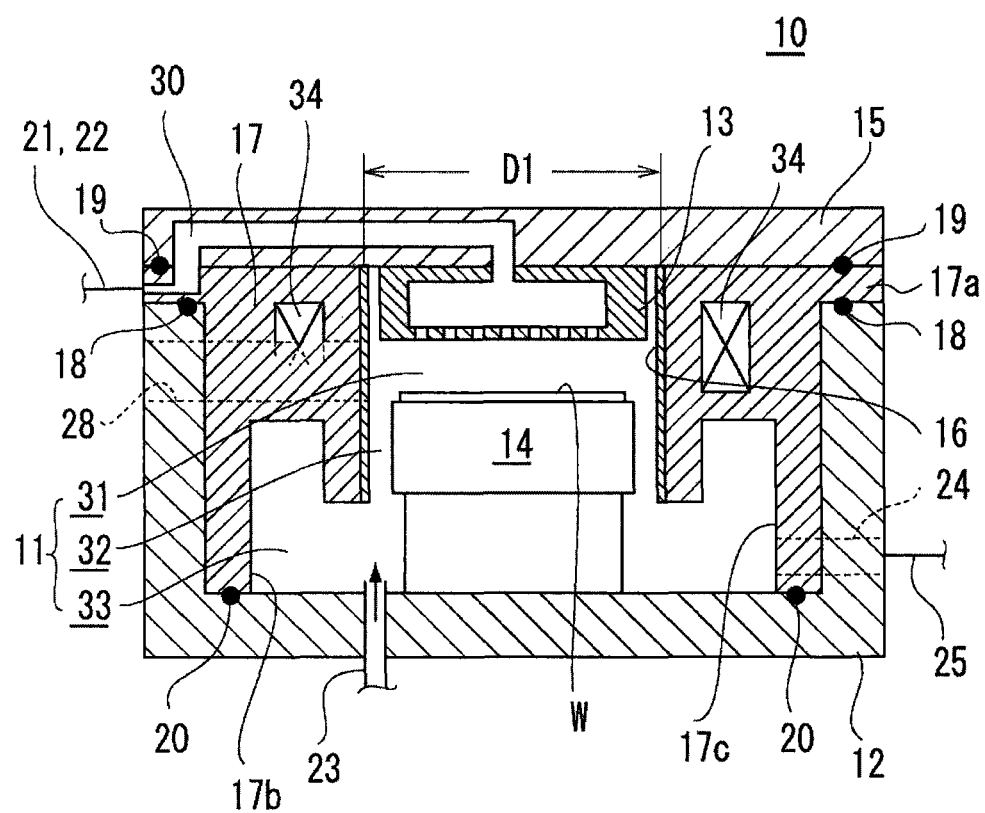
FIG. 4 is a schematic sectional diagram showing a structure of the thin film production apparatus according to the embodiment of the present invention.

FIG. 4 is a sectional view schematically showing an inner structure of the thin film production apparatus 10. The thin film production apparatus 10 includes the vacuum tank 12, a lid body 15 closing an upper portion of the vacuum tank 12, the stage 14 for supporting the substrate W, and the gas head 13 mounted to the lid body 15 so as to be opposed to the stage 14.

A spatial area between the gas head 13 and the stage 14 serves as a reaction space 31 in which the material gas and the reaction gas react with each other to form a metal thin film on the substrate W. Further, between the vacuum tank 12 and the lid body 15, an inner block 17 for determining a volume of the reaction space 31 is disposed.

The inner block 17 is formed as a single ring-like block body provided between an inner wall surface of the vacuum tank 12 and an outer circumferential portion of the stage 14. Specifically, in this embodiment, the inner block 17 has an annular structure. An outer diameter of the inner block 17 is substantially the same as an inner diameter of the vacuum tank 12. An inner circumferential portion of the inner block 17 is opposed to an outer circumferential portion of the gas head 13 and the outer circumferential portion of the stage 14. An inner diameter of the inner block 17 is adjusted to an intended width of the reaction space 31 to thereby determine the volume of the reaction space 31.

Figure 5:
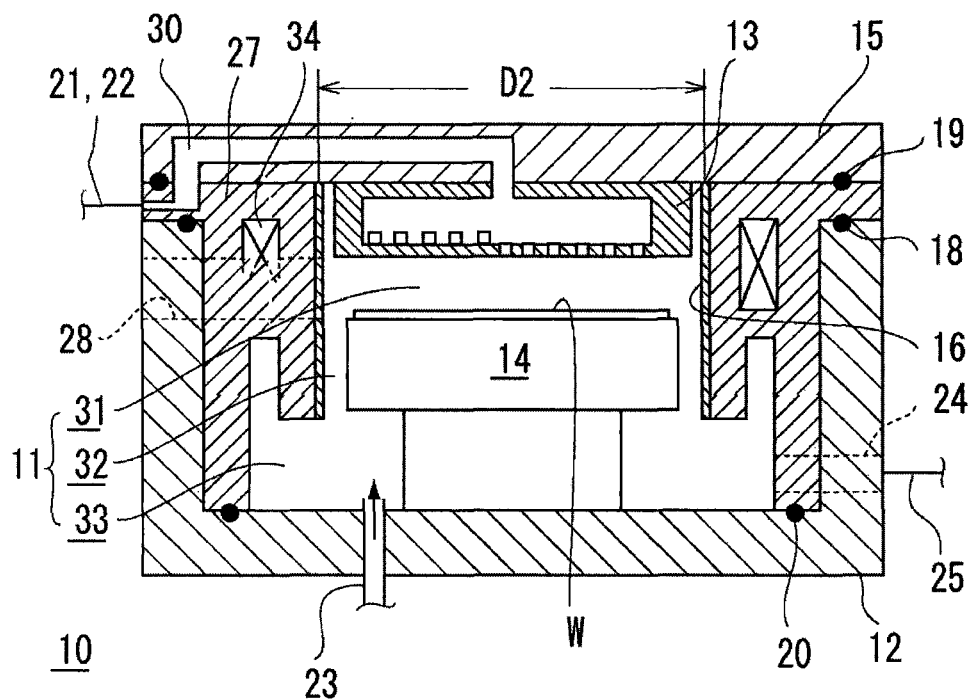
FIG. 5 is a schematic sectional diagram showing another structure of the thin film production apparatus according to the embodiment of the present invention.

Herein, as the inner block 17, plural inner blocks are prepared in order to form an optimum reaction space in accordance with a size (outer diameter of the gas head 13 and outer diameter of the stage 14) of the substrate W to be processed. In a case where the size of the substrate is, for example, ɸ 200 mm, the inner block 17 with which a width of the reaction space 31 becomes D1 is employed as shown in FIG. 4. In a case where the size of the substrate is, for example, ɸ 300 mm, an inner block 27 with which a width of the reaction space 31 becomes D2 is employed as shown in FIG. 5. The inner block 17 is different from the inner block 27 only in inner diameter, and description of the inner block 17 will thus be made as a representative example in the following description.

The inner block 17 is made of a metal material such as aluminum and stainless steel and is disposed between the vacuum tank 12 and the lid body 15 to determine the volume of the reaction space 31, and also functions as a companion flange that is used when the lid body 15 is mounted to the vacuum tank 12. A circumferential edge portion 17a of the inner block 17 is sandwiched between the vacuum tank 12 and the lid body 15 via annular seal members 18 and 19. A lower end portion 17b of the inner block 17 is mounted to a bottom portion of the vacuum tank 12 via a seal member 20. With this structure, precipitation of material elements to the inner wall surface of the vacuum tank 12 due to circulation of a deposition gas is prevented. Further, the inner block 17 is provided at the lower end portion 17b side thereof with an annular recess portion 17c for properly adjusting a volume of a exhaust space with respect to the reaction space.

The processing chamber 11 inside the vacuum tank 12 has three spaces, i.e., the reaction space 31, an exhaust path 32, and a lower space 33, defined by the inner block 17 disposed between the vacuum tank 12 and the lid body 15. The reaction space 31 is defined by the gas head 13, the stage 14, and the inner circumferential portion of the inner block 17. The exhaust path 32 is formed as an annular space between the outer circumferential portion of the stage 14 and the inner circumferential portion of the inner block 17.

The lower space 33 is defined between the recess portion 17c of the inner block 17 and the outer circumferential portion of the stage 14. The lower space 33 communicates via the exhaust path 32 with the reaction space 31 and has a volume larger than the volume of the reaction space 31. Further, the lower space 33 is formed with a exhaust port 24 that is an opening that penetrates the inner block 17 and the vacuum tank 12. The exhaust port 24 is connected with a vacuum exhaust line 25. Further, a gas introduction port 23 for introducing an inert gas for controlling a gas partial pressure into the lower space 33 is provided to the bottom portion of the vacuum tank 12.

To the inner circumferential portion of the inner block 17, an adhesion prevention plate 16 for preventing adhesion of the deposition material to the vacuum tank 12 and the inner block 17 is mounted. Further, the inner block 17 has a built-in heating source 34 capable of heat-adjusting the adhesion prevention plate 16 to a predetermined temperature. The heating source 34 is composed of a heater, but may alternatively be formed of a circulation flow path of a heating medium or the like. It should be noted that the vacuum tank 12 may be formed so as to be capable of being temperature-controlled apart from the inner block 17.

Meanwhile, the stage 14 is composed of a hot plate capable of heating the substrate W to a predetermined temperature. A mechanism for holding the substrate W may be an electrostatic chuck mechanism or a mechanical clamp mechanism. The substrate W is conveyed to the stage 14 and conveyed from the stage 14 to outside the vacuum tank 12 by a not-shown substrate convey robot via an opening 28 penetrating the inner block 17 and the vacuum tank 12.

Further, the gas head 13 is composed of a shower head for uniformly supplying the deposition gas to the surface of the substrate W. Introduction of the deposition gas into the gas head 13 is performed through a gas introduction line 30 structured by connecting flow paths respectively formed in the lid body 15 and the inner block 17. The gas introduction line 30 is connected to the reaction gas supply line 21 and/or the material gas supply line 22.

In the thin film production apparatus 10 according to this embodiment structured as described above, the volume of the reaction space 31 is determined by the inner block 17 disposed inside the vacuum tank 12, whereby the volume of the reaction space is optimized by merely altering the size of the inner diameter of the inner block 17 without altering the size of the vacuum tank 12. Further, since the inner block 17 has the built-in heating source 34, the wall surface defining the reaction space 31 can be optimally temperature-controlled, use efficiency of the deposition gas supplied by the gas head 13 can be improved, and, at the same time, the deposited film quality can be improved.

Thus, according to this embodiment, film formation on plural kinds of substrates having different sizes can be performed with a common vacuum tank, and there is no need to design and alter the vacuum tank for each substrate and for each process. Further, increase of the number of apparatus structural components to be prepared for each size of the substrate to be processed can be minimized, whereby the cost of the components can be reduced, and, while simplifying assembling operation, product inspection operation, and adjusting operation, excellent deposition efficiency and stable film formation can be realized.

Further, the processing chamber 11 inside the vacuum tank 12 is constituted by the reaction space 31, the exhaust path 32, and the lower space 33 having the above-mentioned structures, thereby realizing isotropic exhaust of the deposition gas supplied to the reaction space 31 and contributing to improvement of deposition efficiency.

Specifically, the volume of a secondary side of the exhaust path 32, i.e., the lower space 33, is made to be larger than the volume of the reaction space 31, and the inert gas for controlling gas partial pressure is introduced into the lower space 33, whereby precipitation temperature of the material elements in the deposition gas with respect to the inner wall surface of the lower space 33 can be decreased. As a result, adhesion of the deposition material to the lower space 33 is suppressed, and the temperature of the wall surface defining the lower space 33 can be decreased, thereby decreasing energy required to heat the inner block 17, i.e., decreasing power consumption.

Further, the gas introduction line 30 for introducing the deposition gas into the gas head 13 is formed in the lid body 15 and the inner block 17, so an introduction mechanism for the deposition gas is not required to be provided to the vacuum tank 12. By merely altering the inner block 17 and the lid body 15 (gas head 13) in accordance with the substrate size, the introduction mechanism for the deposition gas can readily be constituted.

As described above, according to this embodiment, by structuring the thin film production apparatus 10 such that alterations required in the thin film production apparatus 10 for each substrate size and for each process rely on the alterations of the inner block 17, the amount of alterations of the parts other than the inner block 17 in the thin film production apparatus 10 can be reduced, and stable film formation with improved deposition efficiency and with less particles becomes possible.

Subsequently, FIG. 6 schematically shows a structure of a thin film production apparatus 40 according to another embodiment of the present invention. It should be noted that, in the figure, parts corresponding to those of the thin film production apparatus 10 described above are denoted by the same reference symbols and detailed description thereof will be omitted.

The thin film production apparatus 40 according to this embodiment includes, between the lid body 15 and the inner block 17, a spacer block 41 for adjusting a distance between the stage 14 and the gas head 13. The spacer block 41 is mounted to the lid body 15 via a seal member 42 and to the inner block 17 via a seal member 43. Further, a gas introduction line 44 for introducing the deposition gas into the gas head 13 is structured by connecting flow paths respectively formed in the lid body 15, the spacer block 41, and the inner block 17.

According to the thin film formation apparatus 40 of this embodiment, not only by adjusting the inner diameter of the inner block 17 but also by adjusting the distance between the stage 14 and the gas head 13 with the spacer block 41, a height and the volume of the reaction space 31 can be optimized for each substrate size and for each kind of process. It should be noted that, instead of additionally providing the spacer block 41, the inner block 17 may have the function of the space block 41.

The embodiments of the present invention have been described above. As a matter of course, the present invention is not limited thereto, and various modifications can be made based on the technical ideas of the present invention.

For example, in the above embodiments, there has been described the case where the inner blocks 17 and 27 having different diameters are selectively used depending on the size of the substrate W. Alternatively, as shown in FIGS. 7A and 7B, an inner block 50 may, for example, be structured as a combined body of three annular block bodies 51, 52, and 53 having inner diameters d1, d2, and d3, respectively, and the inner side block bodies 52 and 53 may be attached/detached depending on the substrate size. It should be noted that the number of the annular block bodies to be combined is not limited to the example shown in the figure.

What is claimed is:

1. A deposition apparatus comprising:
a vacuum tank:
a lid body closing an upper portion of the vacuum tank;
a stage for supporting a substrate to be processed;
a gas head mounted to the lid body such that the gas head is opposed to the stage; and
an inner block disposed between the vacuum tank and the lid body and including a built-in heating source, the inner block determining a volume of a reaction space between the stage and the gas head,
wherein the inner block includes a plurality of annular block bodies each having a different inner diameter,
wherein a first body of the plurality of annular block bodies mates against the vacuum tank, a second body of the plurality of annular block bodies includes a flange that bears on the first body, and a third body of the plurality of annular block bodies includes a flange that bears on the second body, and
wherein the annular bodies are attached and detached to vary the volume of the reaction space.

2. The deposition apparatus according to claim 1, wherein the inner block is an annular block body disposed between an inner wall surface of the vacuum tank and an outer circumferential portion of the stage, and
wherein the circumferential edge portion is mounted to the vacuum tank and the lid body via seal members.

3. The deposition apparatus according to claim 1, wherein an adhesion prevention plate is attached to an inner circumferential portion of the inner block.

4. The deposition apparatus according to claim 1, wherein the vacuum tank has a lower space including an exhaust port formed therein, the lower space communicating with the reaction space via an exhaust path formed between an inner circumferential portion of the inner block and the outer circumferential portion of the stage, and
wherein the lower space has a volume larger than a volume of the reaction space.

5. The deposition apparatus according to claim 4, wherein the lower space includes a gas introduction port for controlling a gas partial pressure.

6. The deposition apparatus according to claim 1, wherein the lid body and the inner block are formed with a gas introduction line for introducing a deposition gas into the gas head.

7. The deposition apparatus according to claim 1, further comprising a spacer block, for adjusting a distance between the gas head and the stage, disposed between the lid body and the inner block.

8. The deposition apparatus of claim 1, wherein only the first body mates against the vacuum tank.

9. The deposition apparatus of claim 1, wherein the first body has a first height, and wherein the remaining bodies have heights less than the first height.

10. The deposition apparatus of claim 1, further comprising a seal member disposed between the inner block and a bottom wall of the vacuum tank.

11. The deposition apparatus of claim 1, wherein the reaction space volume is determined according to a size of the substrate.

12. The deposition apparatus of claim 1, wherein the first body is in contact with an entirety of an inner circumferential surface of the vacuum tank.

13. The deposition apparatus of claim 1, wherein the first body mates against a portion of the lid body.

14. The deposition apparatus of claim 1, wherein the gas head is mounted to a surface of the lid body such that any line drawn through the gas head intersects the lid body on only one side of the gas head.

15. The deposition apparatus of claim 1, wherein:
the inner block has a first inner diameter in a plane above the stage,
the inner block has a second inner diameter in a plane below the stage,
the second inner diameter defines a volume of a lower space,
the second inner diameter is greater than the first inner diameter, and the lower space has a greater volume than the reaction space.

16. The deposition apparatus of claim 15, further comprising a gas introduction port, coupled to the lower space, that introduces inert gas to control gas partial pressure in the lower space.

\* \* \* \* \*